United States Patent [19]

Halsey et al.

[11] Patent Number: 4,806,933
[45] Date of Patent: Feb. 21, 1989

[54] CW AND PULSE CAPABLE CRYSTAL VIDEO RECEIVER

[75] Inventors: James D. Halsey, Charlottesville; Ernest S. Gasser, Earlysbille, both of Va.

[73] Assignee: Sperry Marine Inc., Charlottesville, Va.

[21] Appl. No.: 899,262

[22] Filed: Aug. 22, 1986

[51] Int. Cl.[4] .............................................. G01S 13/00
[52] U.S. Cl. ........................................ 342/91; 342/93
[58] Field of Search ..................... 342/91, 93, 19, 198, 342/13, 20

[56] References Cited

U.S. PATENT DOCUMENTS

| | | | |
|---|---|---|---|
| 3,573,820 | 4/1971 | Bohacek | 342/91 |
| 3,617,998 | 11/1971 | Freedman | 342/93 |
| 4,194,206 | 3/1980 | Tsui et al. | 342/13 |
| 4,274,095 | 6/1981 | Phipps et al. | 342/93 |

*Primary Examiner*—Theodore M. Blum
*Assistant Examiner*—Gregory C. Issing
*Attorney, Agent, or Firm*—Seymour Levine

[57] ABSTRACT

A crystal video receiver having CW and pulse detection capability includes a threshold signal generator which switchably provides fixed and noise riding threshold signals, used to determine initial signal detection. Track and hold circuits provide a second threshold, derived from the peak received signal level, for establishing the termination of received video pulses. A pulse width counter is coupled to determine the time a received pulse signal is between the two thresholds and is set to overflow at a predetermined time after the reception of a signal to establish a pulse representative of a received CW signal and to prevent receiver lock up.

7 Claims, 3 Drawing Sheets

CW AND PULSE CAPABLE CRYSTAL VIDEO RECEIVER

BACKGROUND OF THE INVENTION

1. Field of the Invention

The invention pertains to crystal video receivers and more particularly to crystal video receivers adaptable for detecting CW and pulsed signals and for detecting pulsed signals in the presence of CW signals.

2. Description of the Prior Art

A crystal video receiver registers a signal detection when the incident signal level exceeds a given threshold. When the threshold level is fixed the leading edge of a pulse signal crosses the threshold and locks the receiver to prevent the reception of other signals. This condition persists until the amplitude of the trailing edge decays to a level below the threshold, where after the receiver is reset for the reception of additional signals. A received CW signal having an amplitude greater than the threshold level, however, crosses the threshold and remains above it for the duration of the CW signal, thus locking the receiver and rendering it insensitive to other signals.

A CW at the receiver jammer may be frustrated with the utilization a variable threshold, such as a noise riding threshold. The threshold level of such a variable threshold is determined by the total noise in the system. CW signals are treated as noise in a noise riding threshold system and act only to increase the receiver threshold level. Thus, pulses having peak levels which exceed the amplitude of the cw signal are detectable and the receiver is operable in the presence of the received CW signal. Since the noise riding threshold treats the CW signal as noise, CW signals are not detectable and the system is only useful for the detection of pulse signals.

Direction finding systems operating in a multi-emitter environment must be capable of detecting and processing a multiplicity of received signals. Should the received signals all be pulse modulated it is essential that the video receiver in the system be impervious to lock by a received CW signal. In a multi-emitter environment wherein a CW emitter is in operation the system must be capable of detecting and processing both CW and pulse modulator signals. Such a system must be insensitive to CW signals when processing pulse signals and must have the added capability of detecting and processing CW signals.

SUMMARY OF THE INVENTION

A CW and pulse capable crystal video receiver in accordance with the present invention provides selectable fixed and noise riding threshold signals which are utilized for the detection of CW and pulsed signals respectively. In accordance with the invention, selection of a fixed threshold level permits the detection of CW and pulsed signals. Reception of a CW signal that exceeds the fixed threshold level, however, causes the receiver to lock up for the duration of the received CW signal, thus preventing detection of other signals for a significant time period. To prevent the receiver from being locked up for an inordinant time period, provision is made to reset the receiver at a specified time from the initial reception of the signal having an amplitude that exceeds the fixed threshold.

Selection of the noise riding threshold provides a threshold level that is a function of the received noise energy. In this mode of operation CW signals are treated as noise and consequently are not detectable. The threshold signal that is selected is coupled to a comparator which is also coupled to receive the video signals. This comparator provides a signal detection indication whenever the video signals exceed the threshold level.

A direction finding system constructed in accordance with the principles of the present invention utilizes selectable threshold receivers coupled to the antennas of the system. When the leading edge of the detected pulse video exceeds the established threshold level a counter is activated and continues to count until the pulse amplitude falls below a preset percentage of the peak pulse amplitude. The start and stop times are stored in a memory for entry into a computer as elements of a pulse descriptor. The counter is set to overflow at a time that is longer than the longest pulse width expected and is reset to prevent the system from being locked up by a CW signal when the receivers are in the fixed threshold mode of operation.

In another embodiment of the invention a CW detecting circuit, coupled to the system antennas, couples a signal to the computer upon reception of a CW signal, causing the computer to generate a flag which indicates the presence of a CW signal.

DESCRIPTION OF THE PREFERRED EMBODIMENT

Figure 1:
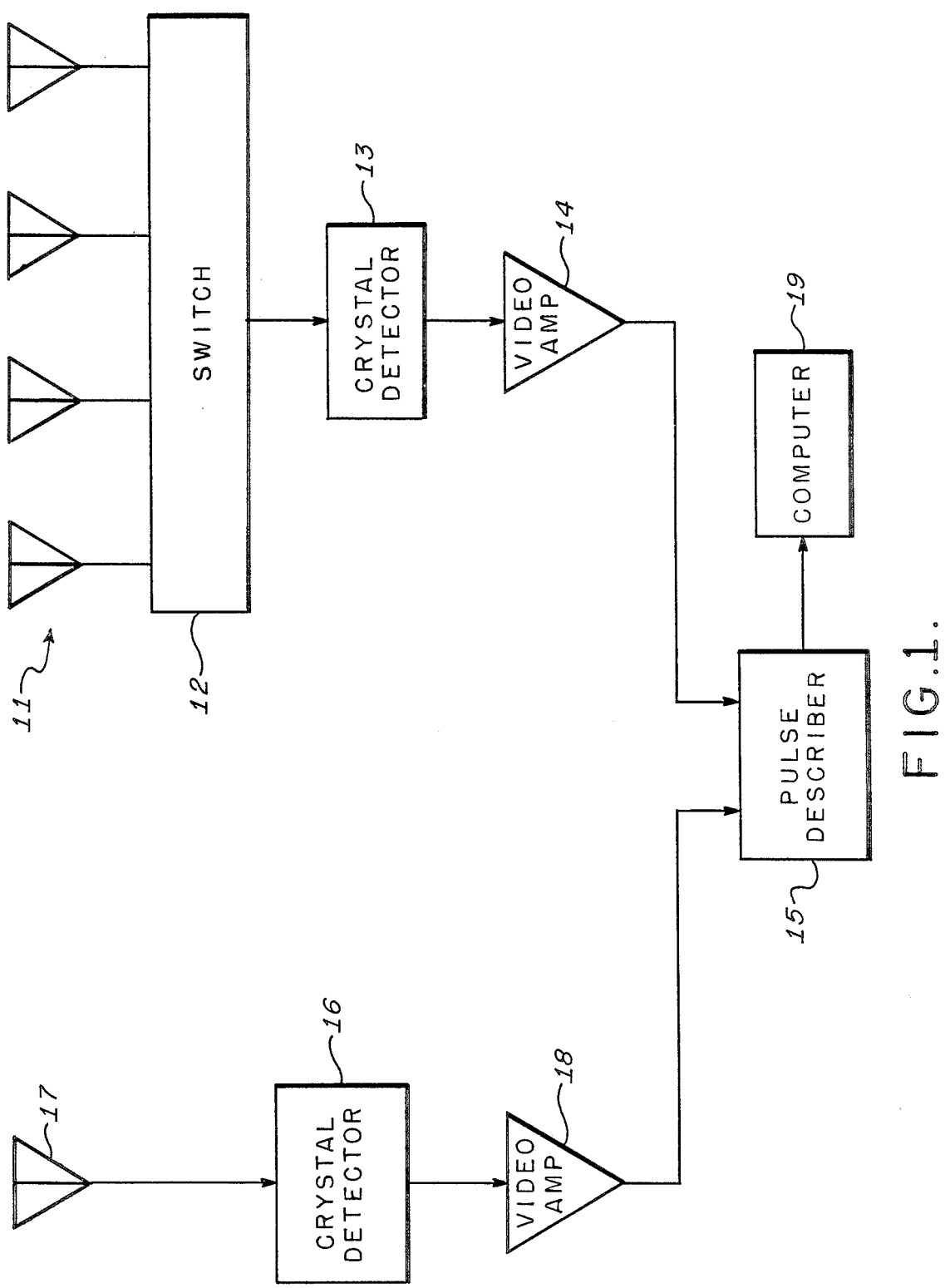
FIG. 1 is a block diagram of an emitter direction finding system utilizing the invention.

Referring to FIG. 1, a system for determining the direction of arrival of an incoming signal may include four broad band antennas 11 each having a three dB beam width of approximately 90 degrees to cover one of four 90 degree azimuthal sectors. A switching circuit 12 sequentially couples each antenna to a crystal detector 13 wherefrom the sector video signal is coupled to video amplifier 14. Amplified video signals from video amplifier 14 are then coupled to pulse describer 15, which will be more fully described subsequently.

Signals from all four quadrants are coupled to a crystal detector 16 via an omni directional antenna 17. Video signals resulting from the detection of these signals are coupled to video amplifier 18 and therefrom to pulse describer 15. Pulse describer 15 measures pulse amplitude, pulse width, and time of arrival of the incoming pulses from video amplifiers 14 and 18 and sends pulse descriptors containing this information to a computer 19 wherein the direction of arrival from each received signal is determined.

Figure 2A:
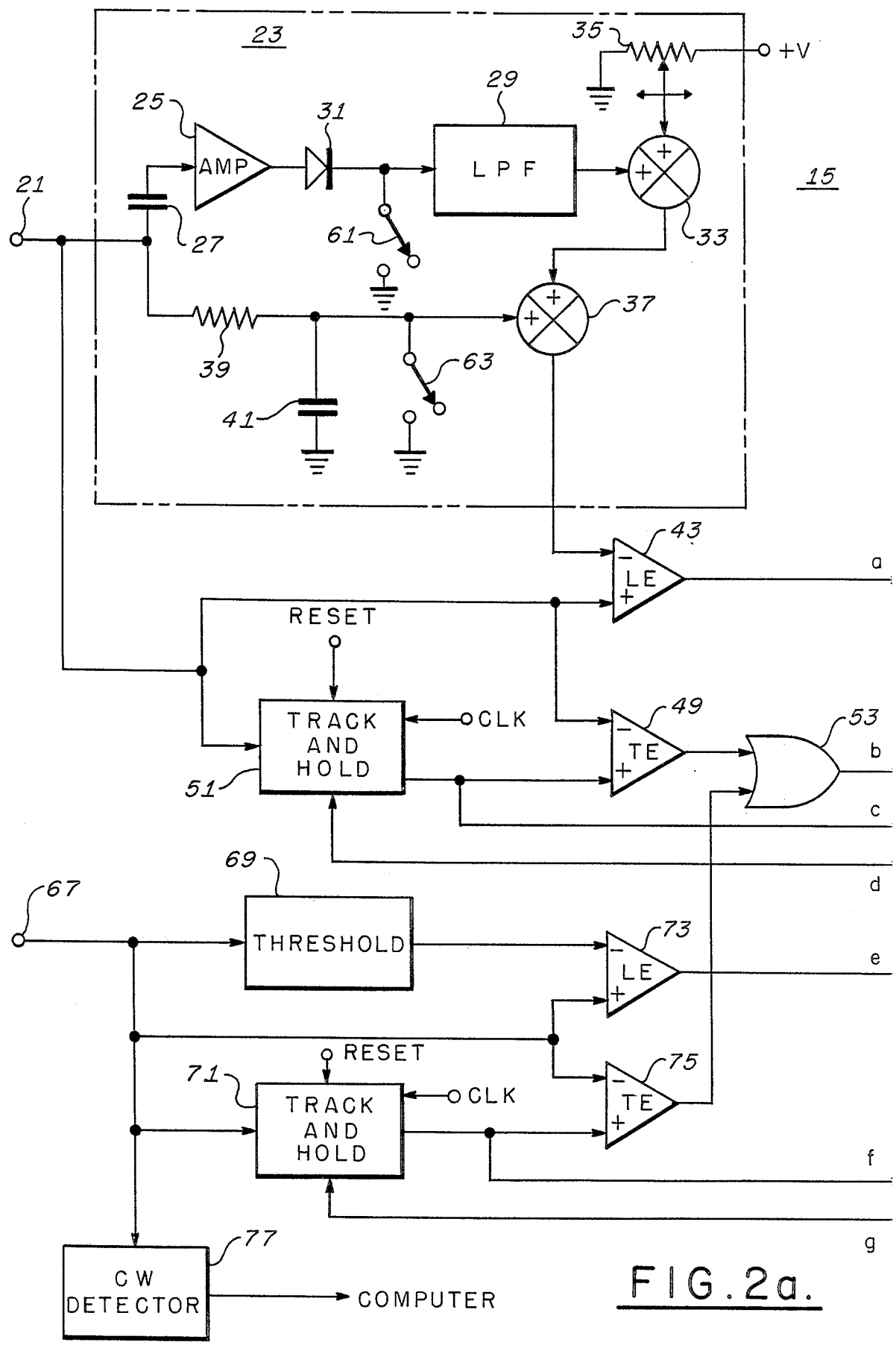
FIG. 2a and 2b are schematic diagrams partially in block form of the pulse describer of FIG. 1.
Figure 2B:
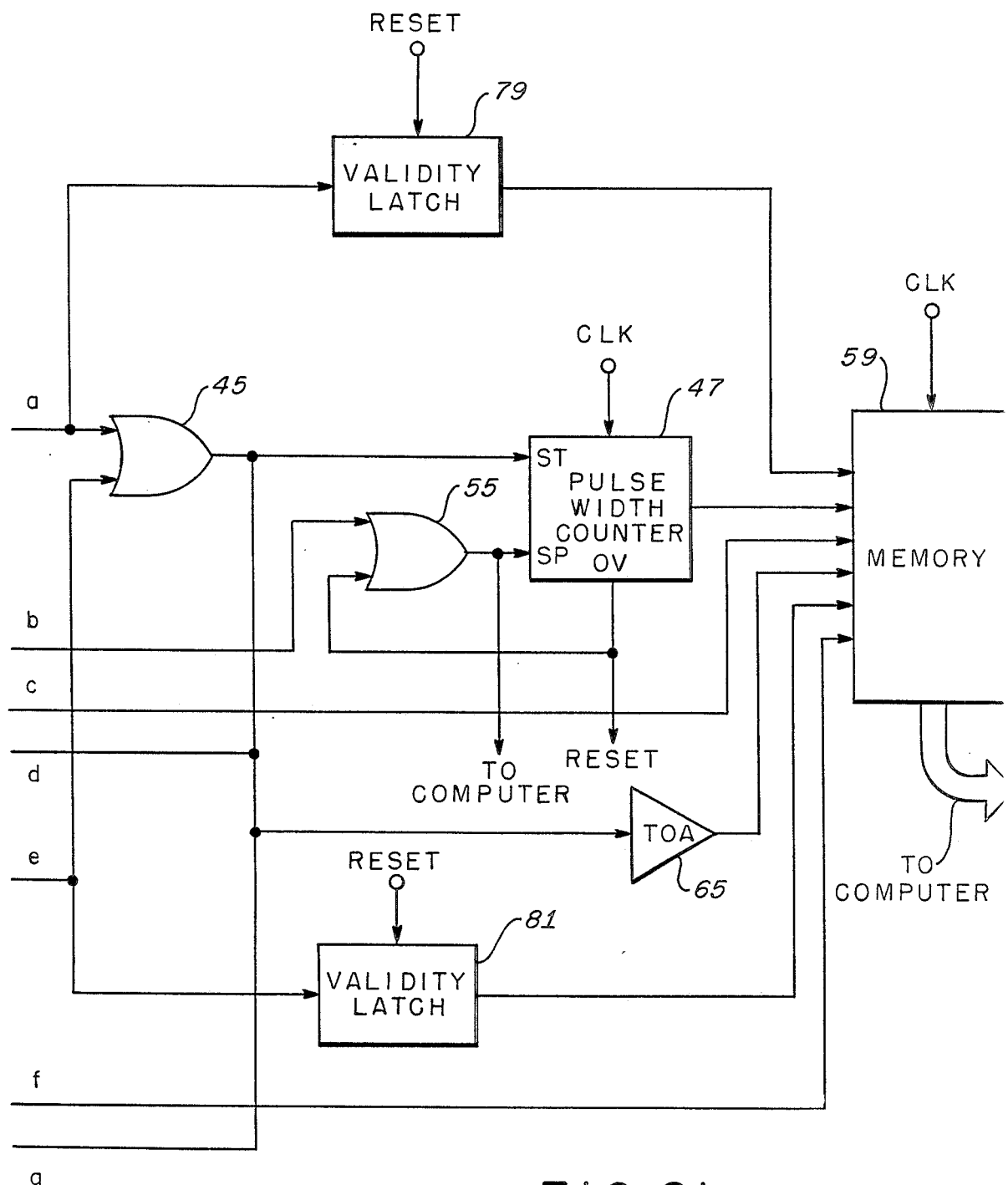

Pulse describer 15 must be capable of processing video pulses in the presence of CW signals and also be capable of processing CW signals. A circuit that provides this capability is shown in FIGS. 2a and 2b. This circuit measures pulse amplitude, pulse width, and time of arrival of incoming pulses and sends this information to the computer in the form of a pulse descriptor. These measurements are accomplished whether or not the video pulses are received in the presence of a CW signal. Additionally, this circuit is capable of determining the amplitude of CW signals.

Video signals resulting from the detection of rf signals received by the four broad band antennas 11 are coupled to the input terminal 21 of the pulse describer 15 and therefrom to a threshold establishing circuit 23, switchable between noise riding and CW modes. Threshold establishing circuit f23 includes a video amplifier 25 coupled to the input terminal 21 via capacitor 27. A low pass filter 29 is coupled to the amplifier 25 via a rectifier 31. Thus received video signals are amplified, rectified and filtered, prior to being coupled to an addition circuit 33, one terminal of which is coupled to the low pass filter 29, a second terminal of the addition circuit 33 is coupled to an adjustable constant level source 35 to provide a signal at the output terminal of the addition circuit 33 that is the sum of the rectified ac signal components of the video at the input terminal 21, coupled via capacitor 27, and the dc voltage set atthe adjustable constant level source 35. The sum terminal of summing circuit 33 is coupled to one input terminal of a second summing circuit 37, a second input terminal of which is coupled to the input terminal 21 via a low pass filter including resistor 39 and capacitor 41. Signals at the output terminal of summation network 37 are the sums of the selected dc voltage, the rectified ac components of the video signal, and the video signal components to the summation circuit 37 coupled, via the low pass filter formed by resistor 39 and capacitor 41. The output terminal of the summation network 37 is coupled to the inverting terminal of a differential amplifier 43, so that the sum signal establishes a threshold level for the differential amplifier 43. The noninverting terminal of differential amplifier 43 is coupled to the input terminal 21 to receive video signals. When the leading edge of a pulse video signal exceeds the established threshold, differential amplifier 43 couples a pulse via OR/gate 45 to a pulse width counter 47 to initiate a pulse width count.

The input terminal 21 is also coupled to the inverting terminal of the differential amplifier 49 and to the input terminal of a track and hold circuit 51, the output terminal of which is coupled with the noninverting terminal of the differential amplifier 49. Track and hold circuit 51 provides a signal at the output terminal thereof at a selected level below the peak value of the signal received at input terminal 21, as for example 20% below this peak value. For the duration of the pulse the peak value exists at the inverting terminal differential amplifier 49 so that a low level signal exists at the output terminal thereof. When the trailing edge of received video pulse falls below the value held in the track and hold circuit 51 the differential amplifier 49 couples a pulse via ORgates 53 and 55 to pulse width counter 47 to stop the pulse count. The pulse width count and the signal representative of the peak amplitude of the pulse at the output terminal of the track and hold circuit 51 are coupled to a memory 59 as elements in a pulse descriptor word.

When the video at the input terminal 21 comprises both a CW and pulse video signal, the received CW signal and ac components of the video pulse will be amplified in amplifier 25, and rectified in the rectifier 31, wherefrom a rectified signal is coupled to summation network 33 via the low pass filter 29. The combination CW and pulse input signal is also coupled to summation network 37 via a low pass filter formed by resistor 39 and capacitor 41. Those skilled in the art will recognize that only the average value of the pulse video and a value near the peak of the CW signal combined to establish the threshold coupled from summation network 37 to differential amplifier 43. Thus in the presence of a CW signal, video signals having amplitudes that are greater than the amplitude of the accompaning CW may still be detected. Further, in the absence of a pulse signal the threshold level at the differential amplifier 43, the summation of the dc voltage, peak CW signal, and noise exceeds the CW signal coupled to the noninverting terminals of amplifier 43, while the peak of the CW signal coupled to the inverting terminals of amplifier 49 always exceeds the peak of the signal held in track and hold circuit 51. Consequently, the output signals of amplifiers 43 and 49 are always at a low level and the incident CW signal is ignored by the receiver.

To receive a CW signal, the noise riding threshold circuitry must be disabled and a fixed threshold coupled to the differential amplifier 43. This may be accomplished by operating switches 61 and 63 to provide a short circuit to ground for the ac coupled and low pass filtered video paths from the input terminal 21. This establishes a fixed threshold at differential amplifier 43 that is determined by the setting of the fixed voltage source 35. A CW signal will cross this threshold and remain above it for the duration of the CW signal. This prevents the receiver from detecting any other signals. Additionally, the continuous characteristic of the CW signal prevents the generation of a stop count signal and therefore of a pulse descriptor to the memory unit 59. To establish the CW signal identification the counter is et to provide an overflow signal at a selected time from the start of a count that is longer than the longest expected video pulse. This overflow signal is coupled to the stop terminals of the pulse width counter 47 via ORgate 55 and is utilized as a reset pulse for the validity latch, yet to be explained, and the track and hold circuits. This CW representative pulse is entered into the memory and the system continues to operate in this manner until the CW is removed or the threshold establishing circuitry 23 is switched to the noise riding threshold mode.

A complete pulse descriptor in memory 59 includes four words, one describing pulse width established by pulse width counter 47, one describing pulse amplitude determined by the track and hold circuit 51, one determining the time of arrival which is established when the pulse or CW signal crosses the threshold at amplifier 43 and is established in the memory by the leading edge of the pulse output of amplifier 43 coupled to the memory via ORgate 45 and amplifier 65, and a pulse validity word, to be described subsequently.

Signals from emitters received from the direction finding antennas are simultaneously received by an omnidirectional antenna and coupled to a second input terminal 67 of the pulse describer 15. This input terminal is coupled to threshold establishing network 69, track and hold circuit 71, noninverting terminal of comparator 73, inverting terminal of comparator 75, and to a CW detector 77. Comparators 73,75 are coupled respectively to OR/gates 45 and 53 to supply the start and stop pulses for pulse width counter 47 and operate in conjunction with threshold establishing circuit 69 and track and hold circuit 71 in the manner previously described.

CW detector 77 is utilized to detect the presence of CW signals. This circuit is operable for both modes of the threshold establishing circuits 23 and 69, but is most useful when the system is in the noise riding threshold mode. CW detector 77 provides a signal indicating the presence of a CW signal when the video received from input terminal 67 exceeds a fixed threshold for a predetermined time duration. This CW indicating signal alerts the computer to the presence of a CW signal. This alert may then be utilized to switch the threshold establishing circuits 23,69 into the fixed threshold mode, so that the system may establish the direction of arrival of the CW signal.

The pulse descriptors for the direction finding and omni received signals are completed by coupling validity words from validity latches 79 and 81 respectively to the memory 59. These validity latched are coupled respectively to receive the output signals from leading edge differential amplifiers 43 and 73. When a threshold crossing occurs these latches are set and validity words are appropriately entered into memory 59. Pulse descriptors are completed with the reception of the stop pulse at the pulse width counter 47. This stop pulse is also coupled to the computer to clock the entry therein of the pulse descriptors.

While the invention has been described in its preferred embodiments it is to be understood that the words which have been used are words of description rather than limitation and that changes may be made within the purview of the appended claims without departing from the true scope and spirit of the invention in its broader aspects.

We claim:

1. An apparatus including:
    first means for receiving CW signals, video signals, and noise;
    first threshold signal means coupled to said first receiving means for selectively providing first fixed threshold signals having amplitudes fixed at preselected levels and first variable threshold signals having amplitudes variable with noise and CW signal levels at said first receiving means;
    first comparator means coupled to said first receiving means and said first signal threshold means for providing signal detection indications when signals coupled from said first receiving means exceed threshold signals coupled from said first threshold signal means;
    said first threshold signal means and said first first comparator means constructed and arranged to prevent CW signal detection when said first variable threshold is selected;
    first signal level detecting means coupled to said first receiving means for providing signals at first predetermined levels below peak levels of signals coupled to said receiving means and holding said first predetermined levels for durations of said signals at said receiving means; and
    second comparator means coupled to said first receiving means and said signal level detecting means for providing signals in accordance with signal levels at said first receiving means and said first predetermined levels;
    said first signal level detection means and said second comparator means constructed and arranged to prevent detection of signals maintaining peak levels at said receiving means.

2. The apparatus of claim 1 wherein said first threshold signal means includes:
    fixed voltage source means for providing a preselected fixed voltage;
    first summation means coupled to receive said preselected fixed voltage and coupled to said receiving means to receive first signals and representative of signals at said receiving means for summing said preselected fixed voltage and said first signals to provide sum signals; and
    second summation means coupled to receive said sum signals from said first summation means and coupled to said receiving means to receive second signals representative of signals at said receiving means for summing said sum signals and said second signals to provide said threshold signals.

3. An apparatus in accordance with claim 2 further including means coupled between said receiving means and said first and second summation means for switchably coupling and decoupling signals at said first receiving means to said first and second summation means.

4. The apparatus of claim 1 further including:
    second means for receiving CW signals, video signals, and noise;
    second threshold signal means coupled to said second receiving means for selectively providing second threshold signals having amplitudes fixed at preselected levels and second variable threshold signals having amplitudes variable with noise levels at said second receiving means;
    third comparator means coupled to said second receiving means and said second threshold signals means for providing signal detection indications when signals coupled from said second receiving means exceed threshold signals coupled from said second threshold signal means;
    said second threshold signal means and said third comparator means constructed and arranged to prevent CW signal detection when said second threshold signals having amplitudes variable with noise levels are selected;
    second signal level detecting means coupled to said second receiving means for providing signals at second predetermined levels below peak levels of signals coupled to said receiving means and holding said second predetermined levels for durations of said signals at said receiving means;
    fourth comparator means coupled to said second receiving means and said second signal level detecting means for providing signals indicative of relative levels between signals at said second receiving means and said second predetermined levels below peak levels;
    said second level detection means and said fourth comparator means constructed and arranged to prevent detection of signals maintaining peak levels at said receiving means.

5. The apparatus of claim 4 further including:
    means coupled to said second receiving means for providing signals indicating detection of CW signals;
    means coupled to said CW indicating means for selecting said first and second threshold signals having amplitudes fixed at preselected levels when CW signals are detected by said indicating means, thereby permitting detection of CW signals by said first and third comparator means.

6. An apparatus in accordance with claim 5 further including means responsive to said signal detection indications of said first and third comparator means for providing signals representative of time of arrival of signals at levels above said threshold levels of said first and second threshold signal means, respectively.

7. An apparatus in accordance with claim 5 further including:

means coupled to said first and third comparator means for providing signals indicative of threshold crossings at said first and third comparator means; and means coupled to all four of said comparators for determining pulse width and pulse amplitude of received video signals.

* * * * *